(12) United States Patent
Witte et al.

(10) Patent No.: US 6,683,483 B1
(45) Date of Patent: Jan. 27, 2004

(54) CLOCK PULSE WIDTH CONTROL CIRCUIT

(75) Inventors: Jeffrey Paul Witte, Fort Collins, CO (US); Quanhong Zhu, Fort Collins, CO (US); Don D. Josephson, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/280,472

(22) Filed: Oct. 25, 2002

(51) Int. Cl.[7] .............................................. H03K 3/017
(52) U.S. Cl. ..................... 327/172; 327/176; 327/141
(58) Field of Search ................................. 327/172, 175, 327/141, 176, 407

(56) References Cited

FOREIGN PATENT DOCUMENTS

EP 1113353 * 4/2001

* cited by examiner

*Primary Examiner*—Dinh T. Le
(74) *Attorney, Agent, or Firm*—Alexander J. Neudeck

(57) ABSTRACT

Two synchronizing flip-flops synchronize the transitions of a slow clock to a fast clock. The state of a version of the synchronized slow clock is stored by a last-state flip-flop that is clocked on an edge of the fast clock. The last-state flip-flop is compared by logic to a version of the synchronized slow clock to produce a pulse with a width determined by either a phase of the fast clock or a cycle of the fast clock.

11 Claims, 2 Drawing Sheets

CLOCK PULSE WIDTH CONTROL CIRCUIT

FIELD OF THE INVENTION

This invention relates generally to integrated circuits, and more particularly, to a circuit for creating a clock signal with a controllable pulse width.

BACKGROUND OF THE INVENTION

Dynamic logic circuits are often used in modern integrated circuits. One problem that can arise with dynamic circuits, however, is the decay, or discharge of a non-driven node over time. This can cause errors. To prevent these types of errors, it may be desirable to shorten one phase of a clock that regulates the timing of some dynamic circuits. By shortening this phase, the amount of time a node spends non-driven may be shortened without affecting the overall average clock cycle time, which may be critical to system performance. Accordingly, there is a need in the art for a circuit that can control the pulse width of a clock.

SUMMARY OF THE INVENTION

Two synchronizing flip-flops synchronize the transitions of a slow clock to a fast clock. The state of a version of the synchronized slow clock is stored by a last-state flip-flop that is clocked on an edge of the fast clock. The last-state flip-flop is compared by logic to a version of the synchronized slow clock to produce a pulse with a width determined by either a phase of the fast clock or a cycle of the fast clock.

DETAILED DESCRIPTION OF THE PREFERRED EMBODIMENTS

Figure 1:
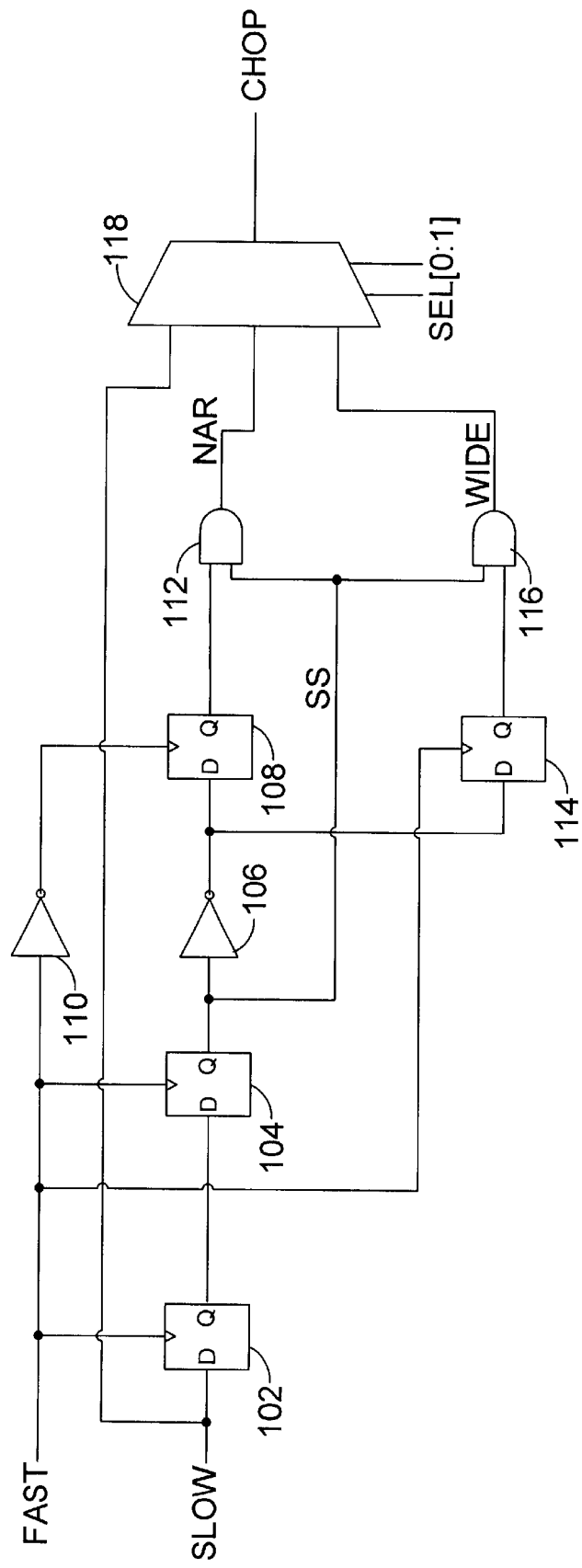
FIG. 1 is a schematic diagram of a clock pulse width control circuit.

FIG. 1 is a schematic diagram of a clock pulse width control circuit. In FIG. 1, two clock signals, FAST and SLOW are input to the circuit. FAST is a high frequency clock that helps determine the pulse width of an output clock. SLOW is a lower frequency clock that helps determine the cycle time of the output clock. FAST is connected to the clock input of D-type flip-flops 102, 104, and 114 and the input of inverter 110. SLOW is connected to the data input of flip-flop 102 and one input of three-input multiplexer 118. The output of inverter 110 is connected to the clock input of D-type flip-flop 108.

The output of flip-flop 102 is connected to the data input of flip-flop 104. The output of flip-flop 104, signal SS, is connected to the input of inverter 106 and a first input of two-input AND gate 112 and a first input of two-input AND gate 116. Signal SS is a synchronized version of SLOW that has been synchronized to the transitions of FAST by synchronizing flip-flops 102 and 104. The output of inverter 106 is connected to the data input of flip-flop 108 and the data input of flip-flop 114. Flip-flops 108 and 114 therefore function to store inverted versions of the last-state of the output of synchronizing flip-flop 104 before the falling and rising edges of FAST, respectively. The output of flip-flop 108 is connected to the second input of AND gate 112. The output of flip-flop 114 is connected to the second input of AND gate 116. The output of AND gate 112, signal NAR, is a narrow chopped-clock and is connected to a second input of multiplexer 118. The output of AND gate 116, signal WIDE, is a wide chopped-clock and is connected to a third input of mulitplexer 118. Multiplexer 118 is controlled by signals SEL[0] and SEL[1] (collectively referred to as SEL[0:1]) to select one of the signals SLOW, NAR, or WIDE to be output on signal CHOP.

Figure 2:
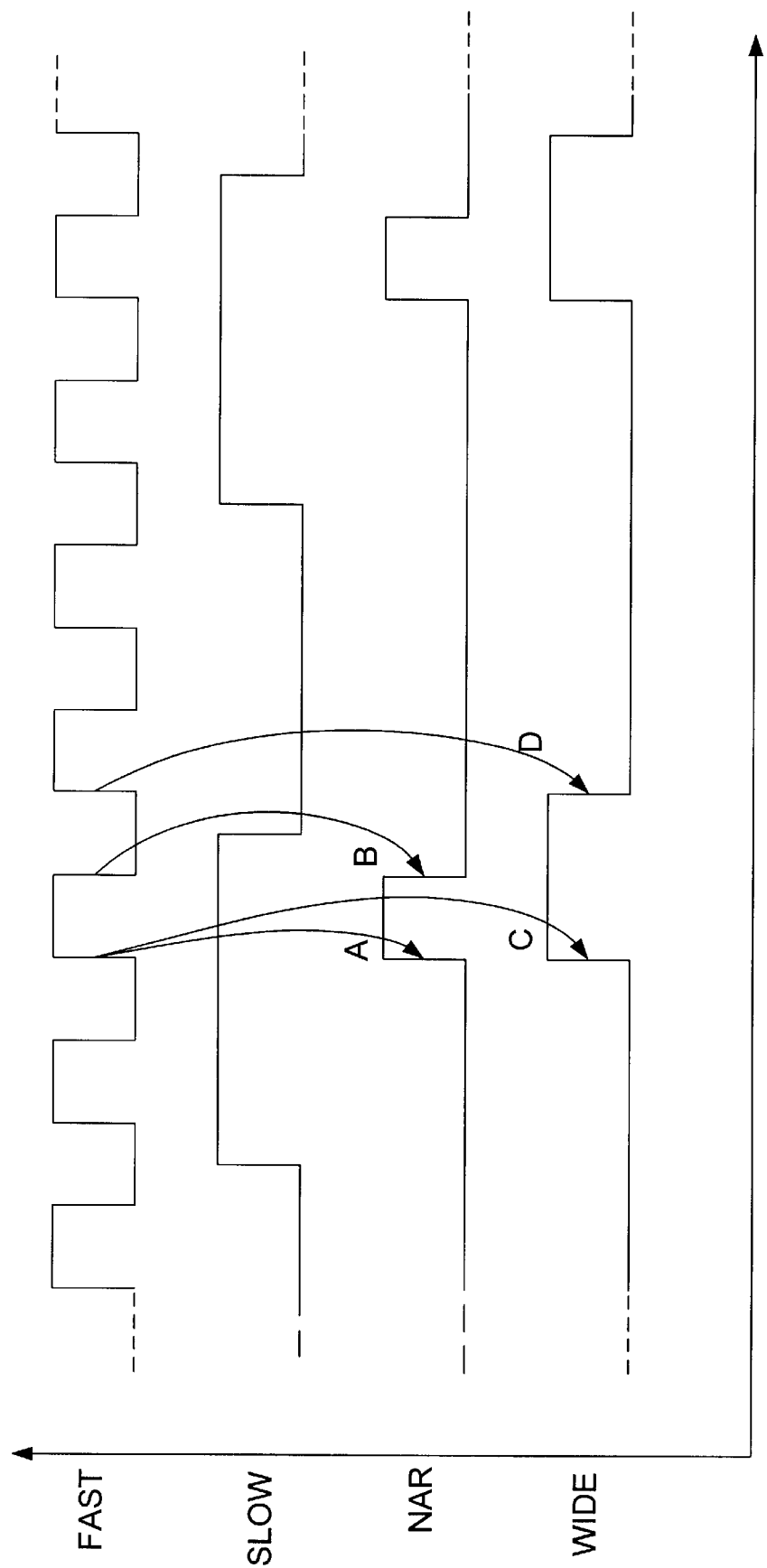
FIG. 2 is an example timing diagram illustrating a relationship between the fast clock, slow clock, narrow chopped clock and the wide chopped clock.

The functioning of the signal path for the generation of the narrow chopped-clock, NAR, will now be described with the aid of FIG. 2. Assuming that the slow clock, SLOW has been low for at least several rising edges of FAST, the initial conditions for this discussion include the output of flip-flops 102 and 104 are low, and the output of flip-flop 108 is high. Therefore, since the output of flip-flop 104, SS, is low, AND gate 112 drives NAR low. When SLOW goes high for at least two rising edges of FAST, the high on SLOW is clocked through flip-flops 102 and 104 thereby bringing SS high. This causes AND gate 112 to drive NAR high (shown by arrow A on FIG. 2). This condition lasts for one phase of FAST since the falling edge of FAST after the second rising edge of FAST clocks flip-flop 108 with a rising edge generated from the falling edge by inverter 110. The data clocked through flip-flop 108 is a low generated by inverter 106 being fed the high on the output of flip-flop 104. This low causes AND gate 112 to drive NAR low (arrow B on FIG. 2). This condition lasts until SLOW goes low again for several rising edges of FAST returning the circuit to the initial conditions described above. Note that NAR was only high for one high phase of FAST. Accordingly, setting the pulse width of FAST, sets the pulse width of NAR, but the frequency that this pulse is repeated is set by SLOW.

The functioning of the signal path for the generation of the wide chopped-clock, WIDE, will now be described. Assuming that the slow clock, SLOW has been low for at least several rising edges of FAST, the initial conditions for this discussion include the output of flip-flops 102 and 104 are low, and the output of flip-flop 114 is high. Therefore, since the output of flip-flop 104, SS, is low, AND gate 116 drives WIDE low. When SLOW goes high for at least two rising edges of FAST, the high on SLOW is clocked through flip-flops 102 and 104 thereby bringing SS high. This causes AND gate 116 to drive WIDE high (arrow C on FIG. 2). This condition lasts for one cycle of FAST until the next rising edge of FAST when FAST clocks flip-flop 114 with a third rising edge. The data clocked through flip-flop 114 is a low generated by inverter 106 being fed the high on the output of flip-flop 104. This low causes AND gate 116 to drive WIDE low (arrow D on FIG. 2). This condition lasts until SLOW goes low again for several rising edges of FAST returning the circuit to the initial conditions described above. Note that WIDE was high for one complete cycle (two phases) of FAST. Accordingly, setting the cycle width of FAST, sets the pulse width of WIDE, but the frequency that this pulse is repeated is set by SLOW.

Note that this circuit has several advantages. One is that it allows the generation of wide chopped clock pulses with a small amount of on-chip resources (circuitry). Another is that the fast clock may be supplied by an off chip source so that is completely asynchronous to the slow clock. Since the fast clock may be supplied by an external source, the pulse width of the chopped-clock (either narrow or wide) may be very finely controlled. The pulse width of the chopped-clock will also not be dependent upon process variations between different integrated circuits or circuit technologies. Note also that the above description assumes certain logic polarities and logic functions such as the AND function provided by gates 112 and 116. However, one of ordinary skill in the art will readily recognize that other logic polarities (For example, a pulse that is low for one phase of the FAST clock.) and other logic functions (such as OR, NOR, NAND, etc.) could also be used.

The circuit described above and shown in FIG. 1 illustrates a circuit to generate chopped-clock pulses that are one or two phases of FAST wide. This may also be extended to 3 or more phases of FAST by adding more last-state flip-flops in series that are clocked by FAST.

What is claimed is:

1. A clock pulse width control circuit, comprising:

a first and second synchronizing flip-flops that synchronize transitions of a slow clock to a fast clock, said fast clock being connected to clock inputs of said first and second synchronizing flip-flops, said slow clock passing through a data input and a data output of each of said first and second synchronizing flip-flops in series, a synchronized version of said slow clock appearing at said data output of said second synchronizing flip-flop;

a last-state flip-flop that stores a last state of said synchronized version of said slow clock; and, state compare logic that compares said stored last-state and said synchronized version of said slow clock to produce a pulse as a result of said compare.

2. The clock pulse width control circuit of claim 1 wherein said last-state flip-flop is clocked on a same edge of said fast clock as said first and second synchronizing flip-flops.

3. The clock pulse width control circuit of claim 1 wherein said last-state flip-flop is clocked on a different edge of said fast clock as said first and second synchronizing flip-flops.

4. A clock pulse width control circuit, comprising:

a fast clock input being clocked by a fast clock and connected to clock inputs of a first, a second, and a third flip-flops for clocking said first, second, and third flip-flops on a fast clock edge, said first flip-flop having a first flip-flop output driving a second flip-flop data input, said third flip-flop data input driven by a second flip-flop output;

a slow clock input connected to a first flip-flop data input; and, a logic function that compares said second flip-flop output and said third flip-flop output to produce a pulse that lasts for a cycle of said fast clock.

5. The clock pulse width control circuit of claim 4 wherein said logic function is an AND function and said third flip-flop data input is driven with an inverted version of said second flip-flop data output.

6. The clock pulse width control circuit of claim 4 wherein said first fast clock edge is a rising edge.

7. The clock pulse width control circuit of claim 4 wherein said first fast clock edge is a falling edge.

8. A clock pulse width control circuit, comprising:

a fast clock input being clocked by a fast clock and connected to clock inputs of a first and a second flip-flops for clocking said first and second flip-flops on a first fast clock edge, said first flip-flop having a first flip-flop output driving a second flip-flop data input;

a slow clock input connected to a first flip-flop data input;

a third flip-flop with a third flip-flop data input driven by a second flip-flop output and being clocked on a second edge of said fast clock that is opposite in polarity to said first fast clock edge; and, a logic function that compares said second flip-flop output and said third flip-flop output to produce a pulse that lasts for a phase of said fast clock.

9. The clock pulse width control circuit of claim 8 wherein said logic function is an AND function and said third flip-flop data input is driven with an inverted version of said second flip-flop data output.

10. The clock pulse width control circuit of claim 8 wherein said first fast clock edge is a rising edge and said second fast clock edge is a falling edge.

11. The clock pulse width control circuit of claim 8 wherein said first fast clock edge is a falling edge and said second fast clock edge is a rising edge.

\* \* \* \* \*